United States Patent
Lopez et al.

(10) Patent No.: US 7,356,110 B2
(45) Date of Patent: Apr. 8, 2008

(54) GAIN CONTROL METHOD FOR A RECEIVER OF SIGNALS TRANSMITTED IN BURSTS AND RECEIVER EXPLOITING IT

(75) Inventors: Patrick Lopez, Livré s/ Changeon (FR); Thomas Schwanenberger, Koenigsfeld (DE); Samuel Guillouard, Chantepie (FR)

(73) Assignee: Thomson Licensing, Boulogne-Billancourt (FR)

( * ) Notice: Subject to any disclaimer, the term of this patent is extended or adjusted under 35 U.S.C. 154(b) by 738 days.

(21) Appl. No.: 10/269,900

(22) Filed: Oct. 11, 2002

(65) Prior Publication Data
US 2003/0108131 A1 Jun. 12, 2003

(30) Foreign Application Priority Data
Oct. 12, 2001 (FR) .................................. 01 13285

(51) Int. Cl.
*H04L 27/08* (2006.01)
(52) U.S. Cl. .................. 375/375; 455/136; 455/138; 455/127.2; 455/232.1; 455/245.1
(58) Field of Classification Search ............ 455/245.1, 455/127.2, 136, 138, 232.1, 239.1, 240.1; 375/345
See application file for complete search history.

(56) References Cited

U.S. PATENT DOCUMENTS 5,668,678 A * 9/1997 Reed et al. .................... 360/51
6,285,666 B1 * 9/2001 Suzuki ......................... 370/320
6,618,452 B1 * 9/2003 Huber et al. .................. 375/343
2002/0054583 A1 * 5/2002 Olesen et al. ................ 370/336

FOREIGN PATENT DOCUMENTS

| EP | 0825711 | 2/1998 |
| WO | 0072441 | 11/2000 |

* cited by examiner

*Primary Examiner*—Ted Wang
(74) *Attorney, Agent, or Firm*—Joseph J. Laks; Robert D. Shedd; Brian J. Cromarty

(57) ABSTRACT

The method is applicable to a receiver (1) of signals corresponding to packets of digital data transmitted in bursts, which comprises an analogue pickup subassembly (3) connected to a digital processing subassembly (8) by means for converting analogue signals into digital signals (7). Gain adjustment means (5) act on the amplification means (5) in order to alter the power of signals supplied to the conversion means.

The method provides a preadjustment of the gain, in the absence of a burst, for detecting the arrival of signals even if they are weak, and an adjustment of the gain as a function of a power value of the signal determined from burst start symbols, as obtained after conversion. This adjustment is dependent on the recognition of symbols scheduled at the start of a burst, it is carried out during a time scheduled for a symbol otherwise left unexploited by the method.

4 Claims, 2 Drawing Sheets

GAIN CONTROL METHOD FOR A RECEIVER OF SIGNALS TRANSMITTED IN BURSTS AND RECEIVER EXPLOITING IT

BACKGROUND OF THE INVENTION

1. Field of the Invention

The invention relates to a gain control method for a radio receiver having to pick up signals corresponding to packets of digital data which are transmitted in bursts.

It also relates to a receiver arranged to allow the exploitation of this method.

2. Description of Related Art

In the field of wireless transmissions and because of the possibilities of relative positioning between transmitter and receiver, a very broad received dynamic power range may have to be exploited. This is especially the case when a transmitter is exploited in connection with mobile receivers and when the power of this transmitter is adjusted in order to allow a distant receiver to receive with enough power when it is under barely favourable conditions, for example at the limit of the region of coverage, which may lead to the reception taking place at high power for a receiver located close to the transmitter.

The proper operation of a receiver with a broad power level range on reception may be difficult to obtain, in particular in the case of a receiver receiving signals corresponding to packets of data transmitted in bursts. It is therefore necessary that the receiver be capable of detecting, without faults, the arrival of a burst preamble which characterizes the arrival of packets. It is therefore necessary that it be capable of quickly adjusting its gain, in order to be able to take account of the packets which follow the preamble of a burst and which constitute the useful part of this burst, whatever the power of the signals received within a particular receiving range.

Receivers are known which have an automatic gain controller acting on the level of the analogue signals which are obtained from signals received by radio and which are then converted into digital form for exploitation.

According to a known embodiment, the received signal level is measured during the preamble contained in signals corresponding to a packet burst and the correction is carried out while the rest of the burst is received. There is therefore a risk that the signals subjected to analogue/digital conversion are degraded and that the result of the conversion is incorrect.

SUMMARY OF THE INVENTION

The invention therefore proposes a gain control method for a receiver having to pick up signals corresponding to packets of digital data which are transmitted in bursts, the said receiver having gain adjustment means making it possible to act on the level of the analogue signals obtained from the signals picked up, before conversion of these analogue signals into digital form. This method is intended to be applied to a system where provision is made that each burst comprises a preamble, the start of which, identical for all the bursts, begins with two particular series of detectable symbols and that the symbols appear one following the other at a particular rate at the output of the conversion means.

According to one characteristic of the invention, the method successively provides:

preadjustment of the gain to a high standby level making it possible to take account of even the weakest signals provided within the reception range set for the receiver, this preadjustment being carried out following the end of reception of a burst and while waiting for a gain adjustment which is carried out on receiving a particular sequence of preamble start symbols of a new burst by the receiver;

adjustment of the gain, as a function of a power value of the signal determined from the preamble start symbols, as obtained after conversion, this adjustment, dependent on the recognition at the start of a new burst of at least one sequence of symbols forming part of the two series which appear systematically at the start of a burst preamble, being controlled in order to be carried out during a time scheduled for a symbol which is part of one of the said series where it comes after the symbols constituting a recognized sequence.

The gain is adjusted in two phases dependent on the recognition, at the start of a burst, of two sequences which appear systematically, one in a first of the two series of symbols scheduled at the start of a burst preamble and the other in the second of these two series, the first phase, dependent on the recognition of the first of the two sequences, resulting in a gain adjustment, which is usually approximate, to a level for which are obtained, either untruncated signals when the signals which have just been received have been determined as being truncated because of their excessive power, or signals near a scheduled backoff level chosen in advance, if the signals which have just been received are determined as weak;

a second phase, carried out following the recognition of the second of the two sequences, resulting in a fine gain adjustment up to a backoff scheduled level.

The adjustment corresponding to each of these two phases is controlled in order to be carried out during a time for the symbol time succession which is scheduled for a symbol coming after the symbols forming the sequence, causing the adjustment, in the series of symbols where this sequence is contained.

The invention also proposes a receiver for radio signals corresponding to packets of digital data transmitted in bursts, which receiver is equipped with an analogue subassembly for picking up signals connected to a digital processing subassembly via means for converting analogue signals into digital signals. This receiver has means available allowing it to detect the appearance of signals corresponding to a burst preamble, gain control means allowing it to act on adjustable gain amplification means in order to alter the power of signals supplied to the conversion means on the basis of signals of the bursts which are picked up.

According to one characteristic of the invention, it specifically comprises means for exploiting the symbols appearing successively at the output of the conversion means at a rate set by a clock circuit of the receiver. These exploitation means are provided, on the one hand, for purposes of recognizing a burst preamble on its arrival and, on the other hand, for purposes of determining the power of the signals applied to the input of the conversion means. This determination is carried out on the basis of the first symbols appearing successively at the output of the conversions means, when these symbols correspond to those provided at the start of a burst preamble. The receiver comprises means for making it possible to alter the adjustable gain of the amplification means, as a function of the power determined for a recognized sequence of preamble symbols and in a particular time scheduled for a symbol which comes immediately after the time scheduled for the last symbol of the recognized sequence.

According to an additional characteristic of the receiver according to the invention, the latter comprises, at the output of the conversion means, means for recognizing a burst preamble carrying out correlations with at least one of the successive series of symbols of a burst preamble start and on the first symbols of each series processed, together with power determining means carrying out a calculation of squaring the numerical values corresponding to the symbols subjected to correlation.

BRIEF DESCRIPTION OF THE DRAWINGS

The invention, its characteristics and its advantages are specified in the following description in connection with the figures mentioned below.

DETAILED DESCRIPTION

Figure 1:
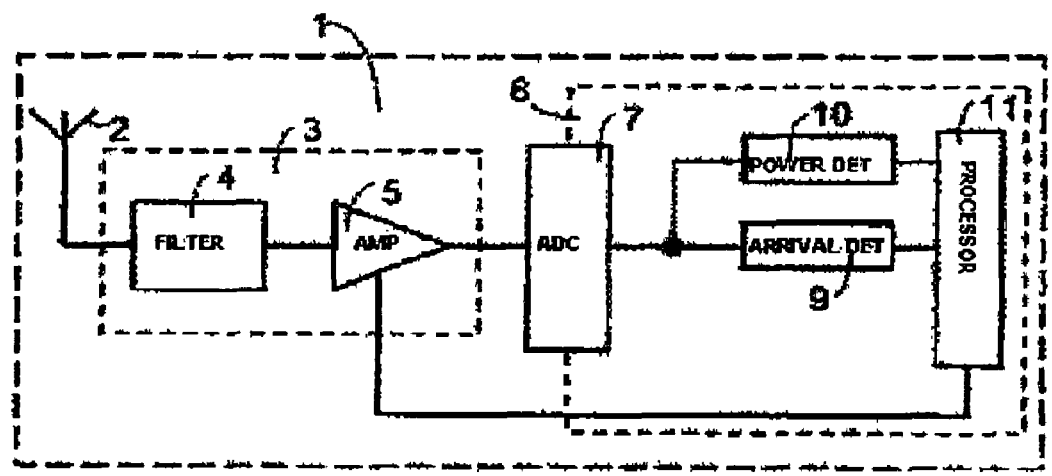
FIG. 1 shows a block diagram of an exemplary receiver of signals transmitted by radio which is scheduled to receive packets of data transmitted in bursts and to implement the automatic gain control method according to the invention.

The exemplary signal receiver 1, which is shown schematically in FIG. 1, comprises an antenna 2 which is exploited by the receiver in order to pick up signals corresponding to packets of data emitted in bursts by a transmitter (not shown), within radio range of which it is assumed to be located. The signals picked up by the antenna 2 for the receiver are transmitted to a subassembly of analogue means 3 which make it possible to extract the useful signals, which have served for the transmission of the data packets of all the signals picked up by the antenna, and for bringing them to a power level coming within the range of power signals that the receiver is capable of exploiting. The subassembly 3 especially comprises filtering means 4 and power adjustment means 5, in this case symbolized by an input filter and by an amplifier stage, respectively, the gain of which can be controlled. These means are placed in series between the antenna and means 7 for converting analogue signals into digital signals which provide the interface between the subassembly of analogue means 3 of the receiver and a subassembly of digital means 8 provided in this receiver for the purpose of exploiting useful signals received. This subassembly of digital means especially comprises means 9 for detecting the arrival of a packet burst, and means 10 for determining the power of the signals received on this occasion. It also comprises processing means 11 which make it possible to exploit the power information supplied by the means 10, on detection of the arrival of a burst by the means 9, in order to act on the power adjustment means 5 so that the conversion means 7 receive signals whose power is within the power range that they accept. The processing means 11 are assumed to combine, in a known manner, processing logic and a clock circuit which is provided in order to synchronize with the signals received by the receiver.

Figure 2:
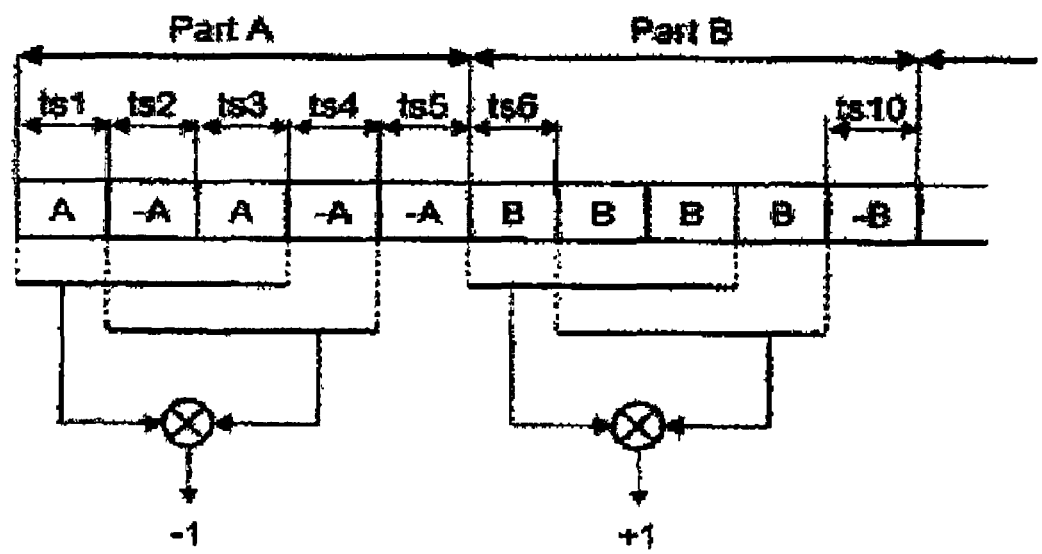
FIG. 2 is a diagram where a succession of symbols characteristic of a burst preamble start and the operations carried out to exploit this succession by applying the automatic gain control method according to the invention are partially shown schematically.

According to the invention and as shown in connection with FIG. 2, provision is made to automatically control the gain on reception of a data packet burst by a receiver. This control is obtained by exploiting the preamble which is transmitted at the head of a burst and by controlling the power adjustment means 5 which this receiver comprises, at particular times, during reception of this preamble.

The automatic gain control, for a receiver according to the invention, means that the signals which are picked up by the antenna of the receiver are transmitted in bursts and that each burst comprises a preamble, the start of which is identical for all of the bursts. The start of a common burst, envisaged here, comprises two characteristic parts A and B, each part consisting of a series of five symbols. These symbols consist of elementary signals quadrature-modulated over a small number of carriers, called orthogonal carriers.

In the case of a preamble according to the Hiperlan 2/IEEE 802.11 standard, the first of the two series envisaged above comprises the same symbol A in the first and in the third position and a symbol −A in the second, fourth and fifth positions. The second series which follows, in the case of the same example, then comprises the same symbol B in the four first positions and a symbol −B in the fifth position. A third characteristic part C conventionally follows the two parts A and B at the preamble start, it is not covered here since it is not exploited within the scope of the gain control method according to the invention. The symbols constituting the preamble and the data packets transmitted within a burst are successively supplied by the conversion means 7 at the rate of one symbol corresponding to sixteen samples per time period ts of 800 nanoseconds in the case of a preamble organized and exploited under the conditions provided for by the standard defined above.

The exploitation of such a preamble by a receiver, making it possible to take account of data packets succeeding this preamble, is made difficult in the case of a wireless network receiver which must be able to pick up the signals of a burst, whatever their power, within an extended range of powers and, for example, between −20 and −90 dB, starting from a level where no signal is received. Now, with current technology, the signals supplied via power adjustment means 5 to the conversion means 7, for conversion into digital form, must have a power level within a much more restricted range, for example from −10 to −25 dB, in order to be exploited. Since it is necessary to detect the burst preambles, even if the power level of the signals which form them is below the acceptable power range, according to the invention, provision is therefore made for preadjustment of the gain to a high standby power level which is enough to allow the receiver to take account of even the weakest signals provided in the reception range set for the receiver. This preadjustment is applied initially, then from the end of a burst. It is kept on standby for a gain adjustment which is carried out on receiving a sequence of first symbols which are located at the start of the preamble of a new burst.

The preamble of a new burst is detected via correlation means of the receiver and in conjunction with the clock circuit of this receiver. In one embodiment relating to a preamble, the start of which begins with two series of five symbols, as envisaged above, a first maximum autocorrelation search can be carried out from the sequence of the first four symbols of the first series of five symbols. This is because the multiplication of the first three symbols of this first sequence by the last three symbols of this same first sequence corresponds to a maximum autocorrelation value which must approximate −1, if the symbols received correspond well to those which are provided in the first series of symbols of a standardized preamble, as defined above.

Since the last symbol of such a first series received is not used for recognition, provision is therefore made to exploit the symbol time ts which corresponds to it in order to carry out a gain adjustment as a function of the power level determination which makes it possible to receive the symbols which are exploited for the correlation operation.

In a preferred embodiment, this power determination is carried out by calculation on the basis the symbols supplied in the form of digital signals by the conversion means 7, this calculation resulting from simply squaring the digital values corresponding to the symbols taken into account.

As soon as a first correlation operation, based on a sequence of four symbols newly received after the end of a burst, makes it possible to determine whether they correspond to a first preamble sequence of a new burst, provision is made to carry out a first gain adjustment, likely only to be approximate, by exploiting the symbol time ts5 following the one which is provided for the fourth symbol of the first sequence, the symbol times of which are referenced from ts1 to ts4 in FIG. 2.

Figure 3:
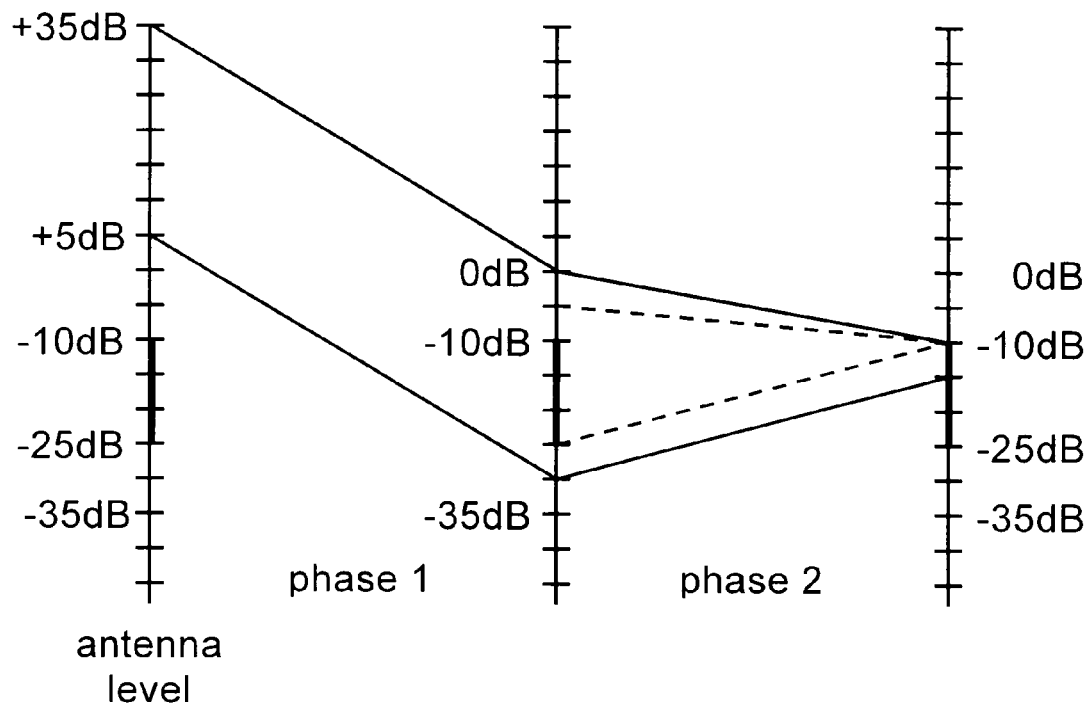
FIG. 3 is a diagram relating to the gain adjustment carried out when receiving high power signals.

When the power level determined for the symbols received at the burst start is raised to the extent that the signals received become truncated, provision is made to act on the adjustment means 5 in order to reduce the gain to a value for which the signals received are no longer truncated. An example of such an adjustment is illustrated in FIG. 3 in a case where the range in which the signals picked up by the antenna 2 are located is between +5 and +35 dB, while the permissible input range of the conversion means 7 is between −25 and −10 dB, as symbolized by a thick line on the three vertical reference axes. Here, the gain is reduced by −35 dB during a first adjustment phase, if it has been possible to find a correlation of level −1 from the first four symbols received which are likely to be part of an incoming burst. As indicated above, the gain reduction control is carried out during the symbol time ts5 relating to the fifth symbol and therefore in a time where signals corresponding to useful data are not provided, so as to eliminate the risks of varying the power level because the receiver is currently receiving data packets of a burst. The gain adjustment which is carried out may possibly allow a suitable gain level to be reached directly, however, this level is not necessarily reached and the adjustment carried out during such a first phase is thus only approximate. In contrast, if the power level determined for the symbols received at the burst start is low and, for example, within a range between −35 and −20 dB, the first gain adjustment is carried out making it possible to bring the power level of the signals applied to the conversion means 7 within the input range provided for these means.

In the example illustrated by the solid lines in FIG. 2, the signals received at the antenna within the range −35 to −20 dB are amplified so as to be located within the input range −25 to −10 dB. The range is possibly reduced for signals whose power is within an intermediate range between high-power signals and low-power signals. It is illustrated by the dotted lines which symbolize a gain reduction of −10 dB for signals whose level is +5 dB and a gain increase of +10 dB for signals whose level is −30 dB.

In so far as it is not always possible for the power level of the signals received to be brought directly to a level for which these signals are within the input range provided for the conversion means 7, a second phase is provided making it possible to refine the adjustment obtained at the end of the first adjustment phase.

According to the invention, the start of this fine adjustment phase depends on the success of a second maximum autocorrelation search which is carried out over a second sequence consisting of the first four symbols of the series of five symbols which comes after the five symbols of a first series received at the start of a new burst. The multiplication of the first three symbols of the second sequence, that is to say symbols received at ranks 6 to 8, by the last three symbols of this second sequence, that is to say symbols received at ranks 7 to 9, must then correspond to a maximum autocorrelation value which must approximate +1, if the symbols received correspond well to those which are provided over the second series of the standardized preamble, as envisaged above.

Provision is made to exploit the symbol time ts10 which corresponds to the last symbol of the second series of the standardized preamble in order to carry out the fine gain adjustment. This adjustment is carried out as a function of the power level determination permitted by the reception of symbols of the second sequence which are exploited for the second correlation. As above, the adjustment time which is chosen makes it possible to eliminate the risks of varying the power level because the receiver is currently receiving data packets of a burst.

Accurate adjustment to a power level scheduled in advance, such as commonly defined in terms of time as scheduled backoff level, is then possible to obtain at the input of the conversion means 7 during a fine adjustment phase, as defined above. This is facilitated by the fact that the approximate adjustment phase has made it possible to define a power level range close to the input range provided for the conversion means.

In the example illustrated in FIG. 3, the objective of the fine adjustment phase is to reach a scheduled backoff level corresponding to the upper limit of the input range, that is −10 dB.

Figure 4:
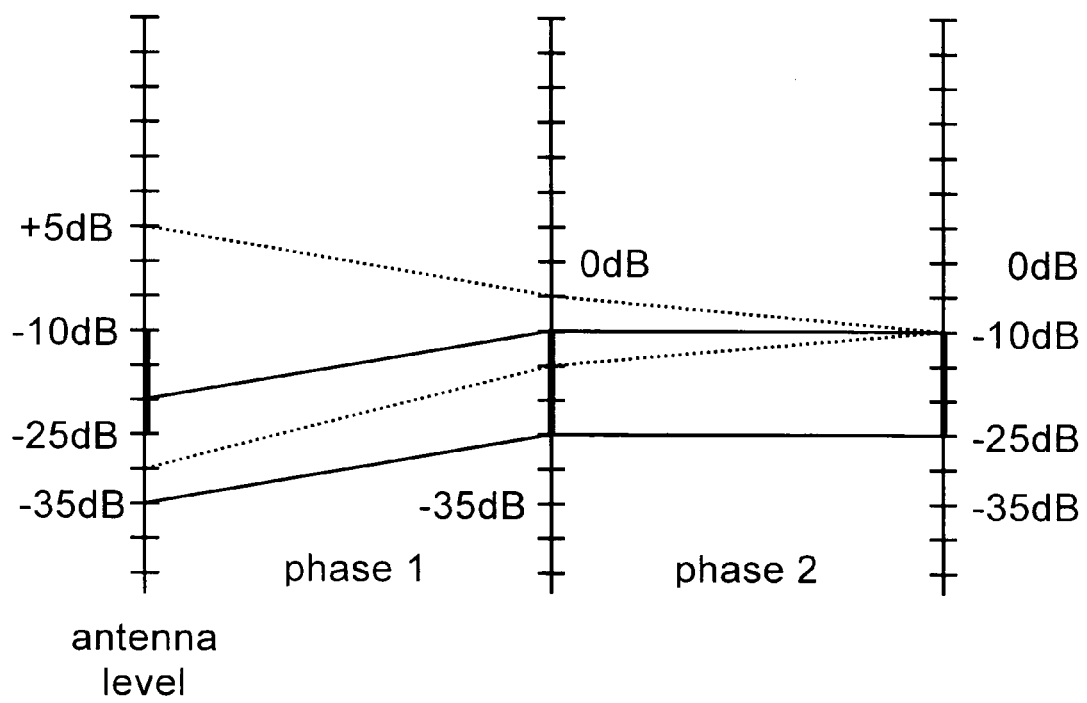
FIG. 4 brings together two diagrams relating to the gain adjustments carried out, when one receiving low power signals and the other when receiving signals whose power is between the high power signals and the low power signals.

Such an objective is likely to be reached after a first adjustment having made it possible to bring the signals back within a range of 0 to −30 dB, which takes account of variations of as much as perhaps plus or minus 5 dB, possibly caused by temperature variations, ageing, disparities of static gain, etc. It involves the possibility of a correction between −15 and +15 dB which makes it possible to set the power range at the input of the conversion means between −10 dB and −15 dB in the example presented and as shown diagrammatically by the solid lines. The theoretical range is illustrated by the dashed lines and would have led to reaching the scheduled backoff value set at −10 dB. The solid and dotted lines, shown in FIG. 4, show respectively that, in the example envisaged, the first adjustment has not been changed so that the weak signals are within the input range of the conversion means and that, otherwise, a fine adjustment makes it possible to reach the scheduled backoff value with an additional correction of between −5 and +5 dB.

What is claimed is:

1. Gain control method for a receiver having to pick up signals corresponding to packets of digital data which are transmitted in bursts, the said receiver having gain adjustment means making it possible to act on the level of the analogue signals obtained from the signals picked up, before conversion of these analogue signals into digital form, when each burst comprises a preamble, the start of which, identical for all of the bursts, results in two particular series of symbols, and when a clock rate is provided for the successive transmission of symbols at particular times after conversion, the method comprising successively:

preadjustment of gain to a high standby level making it possible to take account of even the weakest signals provided within the reception range set for the receiver, this preadjustment being carried out following the end of reception of a burst and while waiting for a gain adjustment which is carried out on receiving a particular sequence of preamble start symbols of a new burst by the receiver;

adjustment of the gain, as a function of a power value of the signal determined from the preamble start symbols, as obtained after conversion, this adjustment, dependent on the recognition at the start of a new burst of at least one sequence of symbols forming part of the two series which appear systematically at the start of the burst preamble, being controlled in order to be carried out during a time scheduled for a symbol which is part of one of the said series where it comes after the symbols constituting a recognized sequence;

wherein the gain is adjusted in two phases dependent on the recognition, at the start of the burst, of two sequences which appear systematically, one in a first of the two series of symbols scheduled at the start of the burst preamble and the other in the second of these two series;

the first phase, dependent on the recognition of the first of the two sequences, resulting in a first gain adjustment, which is usually approximate, to a level for which are obtained, either untruncated signals when the signals which have just been received have been determined as being truncated because of their excessive power, or signals near a scheduled backoff level chosen in advance, if the signals which have just been received are determined as weak;

the second phase, carried out following the recognition of the second of the two sequences, resulting in a fine gain adjustment up to the scheduled backoff level;

the adjustment corresponding to each of these two phases being controlled in order to be carried out during the time for the symbol time succession which is scheduled for a symbol coming after the symbols forming the sequence, causing the adjustment, in the series of symbols where this sequence is contained.

2. Method according to claim 1, wherein the approximate adjustment of the gain is carried out on recognition, among the first symbols received, of a sequence consisting of the first four symbols of a first series of five in the burst preamble and in that the fine adjustment is carried out on recognition of a sequence, consisting of four symbols of a second series of five which follows the first series in the same burst preamble, the approximate adjustment being carried out during the time allowed for the last of the first five symbols of the first series, the fine adjustment being carried out during the time allowed for the last of the five symbols of the second series.

3. Method according to claim 1, in which the powers are determined from digital signals obtained by conversion of the analogue signals, by squaring numerical values corresponding to these digital signals.

4. Method according to claim 1, wherein the recognition of the two sequences provided in the first two series of symbols of the burst preamble is carried out by correlation for each of the sequences.

* * * * *